(12) United States Patent
Holma et al.

(10) Patent No.: US 9,946,002 B2
(45) Date of Patent: Apr. 17, 2018

(54) ELECTRICAL DEVICE

(71) Applicant: TELLABS OY, Espoo (FI)

(72) Inventors: Antti Holma, Espoo (FI); Jari-Pekka Laihonen, Espoo (FI); Petri Kohonen, Vantaa (FI)

(73) Assignee: CORIANT OY, Espoo (FI)

( * ) Notice: Subject to any disclaimer, the term of this patent is extended or adjusted under 35 U.S.C. 154(b) by 453 days.

(21) Appl. No.: 14/196,553

(22) Filed: Mar. 4, 2014

(65) Prior Publication Data

US 2014/0247618 A1    Sep. 4, 2014

(30) Foreign Application Priority Data

Mar. 1, 2013   (FI) ...................................... 20135200

(51) Int. Cl.
  *G02B 6/00*   (2006.01)
  *F21V 8/00*   (2006.01)
  *H05K 1/02*   (2006.01)

(52) U.S. Cl.
  CPC ......... *G02B 6/0005* (2013.01); *H05K 1/0274* (2013.01); *F21V 2200/00* (2015.01); *F21V 2200/10* (2015.01); *F21V 2200/13* (2015.01); *F21V 2200/15* (2015.01); *F21V 2200/17* (2015.01); *H05K 2201/09063* (2013.01);
  (Continued)

(58) Field of Classification Search
  CPC ............. F21V 2200/00; F21V 2200/10; F21V 2200/13; F21V 2200/15; F21V 2200/17; G02B 6/0005; H05K 1/0274
  See application file for complete search history.

(56) References Cited

U.S. PATENT DOCUMENTS 5,933,560 A * 8/1999 Ishiharada ........... G02B 6/0005
                                                  385/115
5,988,842 A * 11/1999 Johnsen ............... G02B 6/0008
                                                  200/314
(Continued)

FOREIGN PATENT DOCUMENTS

| CN | 1645172 A   | 7/2005 |
| CN | 102905489 A | 1/2013 |
| DE | 3703423 A1  | 8/1988 |

OTHER PUBLICATIONS

Finnish Search Report, dated Dec. 18, 2013, from corresponding FI application.

*Primary Examiner* — Binh Tran
*Assistant Examiner* — Douglas Burtner
(74) *Attorney, Agent, or Firm* — Young & Thompson

(57) ABSTRACT

An electrical device includes a circuit board (101), a light source (104), and a light guide (105). The light guide receives light from the light source and conducts the received light to an end of the light guide so that the light crosses, in a direction parallel with the circuit board, an edge of the circuit board. The end of the light guide constitutes a display surface for showing the light to a user. On a fringe area extending from the edge of the circuit board a distance (D) towards the opposite edge of the circuit board, the light guide is between geometrical planes parallel and coinciding with surfaces of the circuit board. Hence, the light guide does not require room in directions perpendicular to the circuit board. Therefore, for example, more connectors, key buttons, and/or other instruments can be placed on a control panel of the electrical device.

19 Claims, 3 Drawing Sheets

(52) U.S. Cl.
CPC .............. *H05K 2201/09145* (2013.01); *H05K 2201/10106* (2013.01)

(56) References Cited

U.S. PATENT DOCUMENTS

| | | | | |
|---|---|---|---|---|
| 6,045,249 | A * | 4/2000 | Bellinghausen | G02B 6/4204 340/815.45 |
| 6,302,595 | B1 | 10/2001 | Vilgiate et al. | |
| 7,149,376 | B2 * | 12/2006 | Uchida | G02B 6/43 385/15 |
| 2002/0102058 | A1 * | 8/2002 | Hulse | G02B 6/0005 385/45 |
| 2004/0042705 | A1 * | 3/2004 | Uchida | G02B 6/43 385/14 |
| 2004/0258345 | A1 * | 12/2004 | Griese | G02B 6/138 385/14 |
| 2006/0158746 | A1 * | 7/2006 | Lim | G02B 6/0008 359/709 |
| 2007/0154132 | A1 * | 7/2007 | Mates | D03D 1/0082 385/14 |
| 2008/0013880 | A1 * | 1/2008 | Pitwon | G02B 6/43 385/14 |
| 2008/0044127 | A1 * | 2/2008 | Leising | G02B 6/12004 385/14 |
| 2008/0137361 | A1 | 6/2008 | Ho | |
| 2008/0248661 | A1 | 10/2008 | Costello | |
| 2008/0255641 | A1 * | 10/2008 | Ellis | A61F 7/02 607/96 |
| 2009/0051558 | A1 * | 2/2009 | Dorval | G08B 5/36 340/653 |
| 2009/0093073 | A1 * | 4/2009 | Chan | G02B 6/132 438/24 |
| 2009/0232467 | A1 * | 9/2009 | Kim | G02B 6/1221 385/142 |
| 2009/0304324 | A1 * | 12/2009 | Kim | G02B 6/4224 385/14 |
| 2009/0310905 | A1 * | 12/2009 | Riester | G02B 6/138 385/14 |
| 2010/0074574 | A1 * | 3/2010 | Maeda | G02B 6/4246 385/14 |
| 2010/0150572 | A1 * | 6/2010 | Lee | G06F 13/409 398/141 |
| 2011/0019959 | A1 * | 1/2011 | Kim | C07D 301/06 385/14 |
| 2011/0019960 | A1 * | 1/2011 | Matsubara | G02B 6/4214 385/14 |
| 2011/0052118 | A1 * | 3/2011 | Matsuoka | G02B 6/12002 385/14 |
| 2011/0293226 | A1 * | 12/2011 | Yasuda | G02B 6/3817 385/101 |
| 2012/0008900 | A1 * | 1/2012 | Schneider | G02B 6/3608 385/50 |
| 2012/0081898 | A1 * | 4/2012 | Cave | B23P 11/00 362/249.01 |
| 2012/0128291 | A1 * | 5/2012 | Teitelbaum | G02B 6/4214 385/14 |
| 2012/0263412 | A1 * | 10/2012 | Choi | G02B 6/43 385/14 |

* cited by examiner

ELECTRICAL DEVICE

FIELD OF THE INVENTION

The invention relates to an electrical device comprising at least one light source and at least one light guide for receiving light from the light source and for displaying the light to a user of the electrical device.

BACKGROUND

In many cases an electrical device comprises a circuit board furnished with electrical components. The electrical device can be, for example but not necessarily, an Internet Protocol "IP" router, an Ethernet switch, a MultiProtocol Label Switching "MPLS" switch, and/or an Asynchronous Transfer Mode "ATM" switch. The circuit board comprises a body made of one or more layers of electrically insulating material and electrical conductors on one or both of the surfaces of the circuit board and/or between the layers of the electrically insulating material. Each of the electrical components can be, for example, an integrated circuit such as a processor or a memory, or a discrete component such as a resistor, a capacitor, an inductor, a transistor, or a diode. Furthermore, the electrical device may comprise also other elements than electrical components. Examples of the other elements are elements related to cooling arrangements and optical elements.

The optical elements may comprise, for example, one or more indicator light sources that are controlled according to the operational status of the electrical device. The operational status indicated by the one or more indicator light sources can be for example: "running", "stand-by", "energized", "activated", "armed", "de-activated", "fault", etc. In many cases, the indicator light sources are not in the place where the indicator lights are displayed to a user of the electrical device. For example, the indicator light sources are not necessarily in a control panel of the electrical device but the electrical device comprises one more light guides made of light conducting material and configured to conduct the indicator lights to the control panel where the indicator lights are displayed to the user. In conjunction with some applications, the light guides are called light pipes.

There has been, and there still is, a trend to decrease the physical dimensions of electrical devices as well as to increase the number of connectors and/or other equipment or instruments located on control panels of the electrical devices. Therefore, the room available for light guides of the kind mentioned above has decreased and is still decreasing. Hence, there is a need for technical solutions that are suitable for reducing the room needed for light guides.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new electrical device that can be, for example but not necessarily, a part of telecommunication equipment. An electrical device according to the invention comprises:

- a circuit board having a first surface and a second surface,
- at least one light source on the first surface of the circuit board, and
- at least one light guide for receiving, at a first end of the light guide, light from the light source and for conducting the received light to a second end of the light guide so that the light crosses, in a direction parallel with the circuit board, an edge of the circuit board, the second end of the light guide constituting a display surface for showing the light to a user of the electrical device, wherein, on a fringe area extending from the edge of the circuit board a distance towards an opposite edge of the circuit board, the light guide is between geometrical planes parallel and coinciding with the first and second surfaces of the circuit board. On the above-mentioned fringe area, the light guide is between the geometrical planes without extending though either of the geometrical planes. Hence, on the above-defined fringe area, the light guide does not require room in directions perpendicular to the circuit board. Therefore, for example, more connectors, key buttons, and/or other instruments can be placed on a control panel of the electrical device. The light source can be, for example, an indicator light source that is controlled according to the operational status of the electrical device. The operational status can be for example: "running", "stand-by", "energized", "activated", "armed", "de-activated", "fault", etc.

A number of non-limiting and exemplifying embodiments of the invention are described in accompanied dependent claims.

Various non-limiting and exemplifying embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of unrecited features. The features recited in depending claims are mutually freely combinable unless otherwise explicitly stated. Furthermore, it is to be understood that the use of "a" or "an" throughout this document does not exclude a plurality.

BRIEF DESCRIPTION OF THE FIGURES

Exemplifying embodiments of the invention and their advantages are explained in greater detail below in the sense of examples and with reference to the accompanying drawings, in which.

DESCRIPTION OF EXEMPLIFYING EMBODIMENTS

Figure 1A:
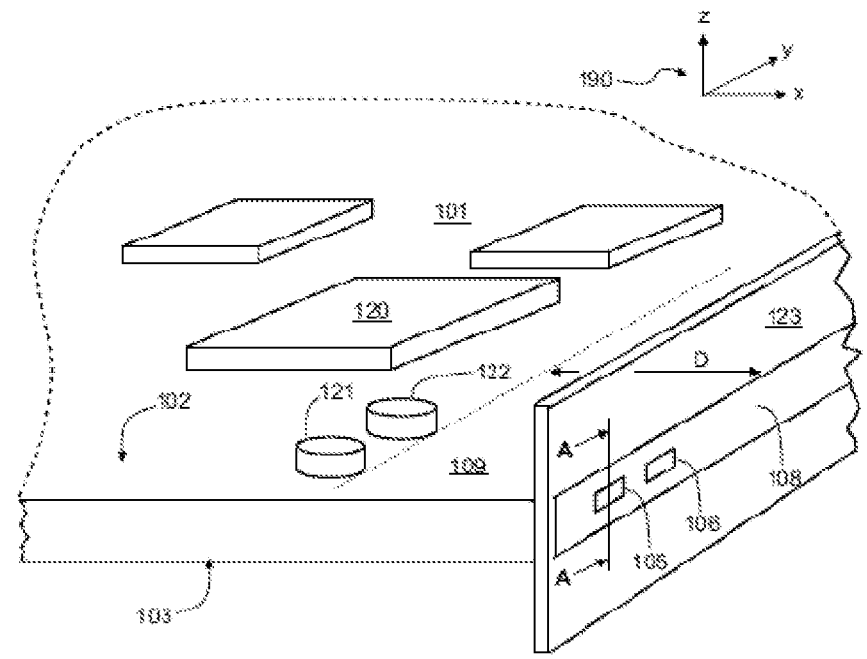
FIGS. 1a and 1b illustrate a detail of an electrical device according to an exemplifying embodiment of the invention.
Figure 1B:
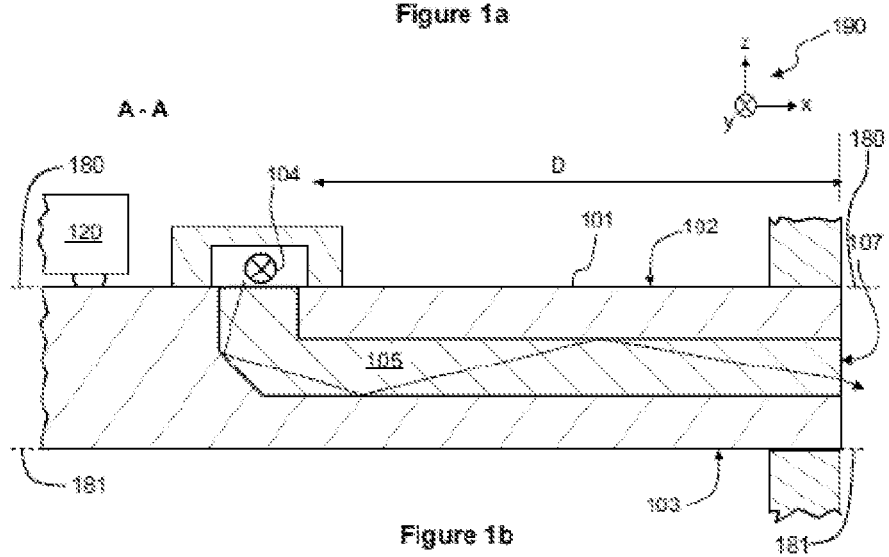

FIG. 1a shows a perspective view of a detail of an electrical device according to an exemplifying embodiment of the invention. FIG. 1b shows a view of a section taken along the line A-A shown in FIG. 1a. The electrical device comprises a circuit board 101 having a first surface 102 and a second surface 103 that are parallel with the xy-plane of a coordinate system 190. The circuit board 101 is furnished with electrical components one of which is denoted with a reference number 120. The electrical device can be, for example but not necessarily, a part of telecommunication equipment and it may comprise, for example, a processing system for supporting at least one of the following data transfer protocols: Internet Protocol "IP", Ethernet protocol, MultiProtocol Label Switching "MPLS" protocol, and/or Asynchronous Transfer Mode "ATM".

The electrical device comprises light sources one of which is illustrated in FIG. 1b and denoted with a reference number 104. The light sources can be, for example, indicator light sources that are controlled by one or more of the electrical components of the electrical device in accordance with the operational status of the electrical device. The light sources are contained by light source elements 121 and 122. The light sources can be, for example, light emitting diodes "LED". One of light beams emitted by the light source 104 is depicted with a dashed line arrow shown in FIG. 1b. The electrical device comprises light guides 105 and 106. Each light guide is configured to receive, at a first end of the light guide, light from the respective light source and to conduct the received light to a second end of the light guide so that the light crosses, in a direction parallel with the circuit board, an edge 108 of the circuit board. The second end of each light guide constitutes a display surface for showing the light to a user of the electrical device. The second end of the light guide 105 constitutes the display surface 107 as illustrated in FIG. 1b. On a fringe area 109 extending from the edge 108 of the circuit board a distance D towards an opposite edge of the circuit board, each of the light guides 105 and 106 is between geometrical planes 180 and 181 parallel and coinciding with the first and second surfaces 102 and 103 of the circuit board 101. Hence, on the above-defined fringe area 109, the light guides 105 and 106 do not require room in directions perpendicular to the circuit board 101. Therefore, for example, more connectors, key buttons, and/or other instruments can be placed on a control panel 123 of the electrical device. The above-mentioned geometrical planes 180 and 181 are parallel with the xy-plane of the coordinate system 190. In FIG. 1b, the geometrical planes 180 and 181 are depicted with dashed lines. It is worth noting that the geometrical planes 180 and 181 are geometric concepts and are not necessarily any physical objects. A geometric concept can be, for example, a geometric point, a straight or curved geometric line, a geometric plane, a non-planar geometric surface, a geometric space, or any other geometric entity that is zero, one-, two-, or three-dimensional.

In the exemplifying case illustrated in FIGS. 1a and 1b, each of the light guides 105 and 106 comprises a strip of light conducting material, where the strip constitutes a part of a layer of the circuit board. The second ends of the light guides are on the edge 108 of the circuit board as illustrated in FIGS. 1a and 1b.

Figure 2A:
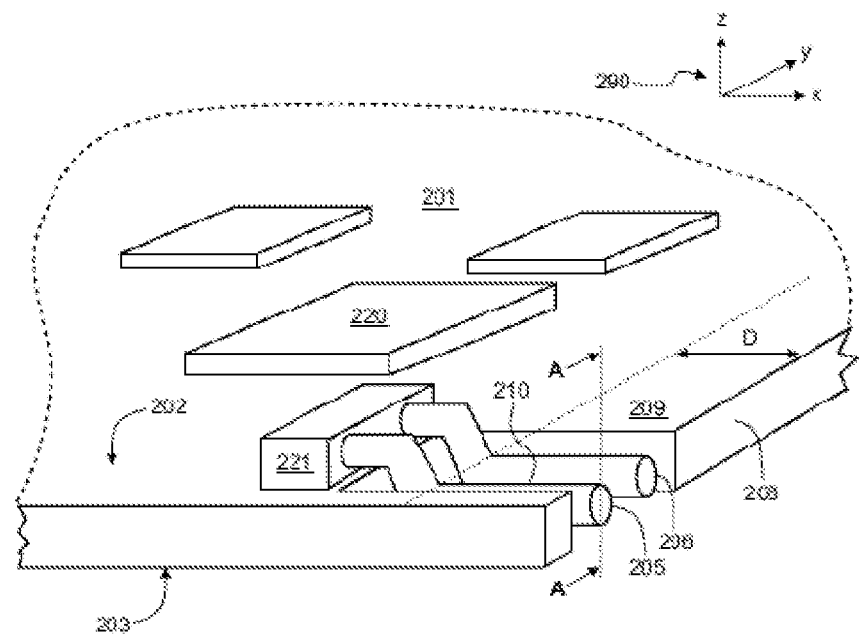
FIGS. 2a and 2b illustrate a detail of an electrical device according to another exemplifying embodiment of the invention.
Figure 2B:
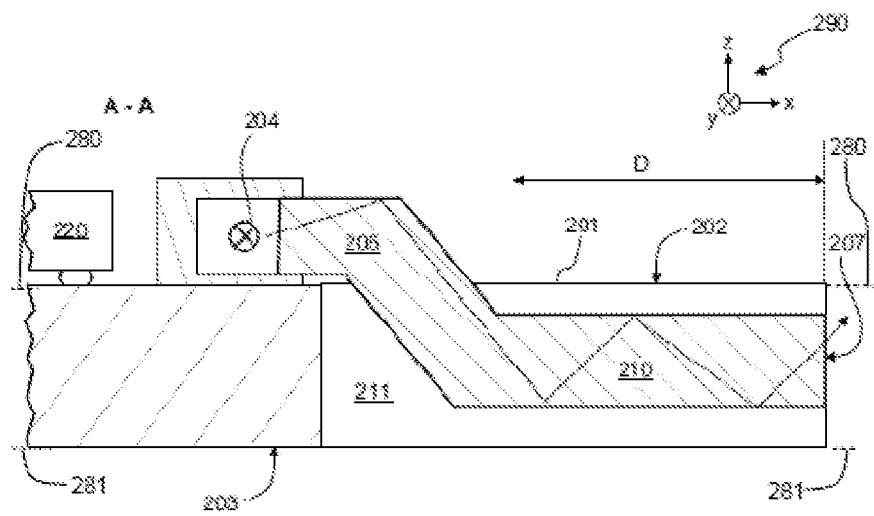

FIG. 2a shows a perspective view of a detail of an electrical device according to an exemplifying embodiment of the invention. FIG. 2b shows a view of a section taken along the line A-A shown in FIG. 2a. The electrical device comprises a circuit board 201 having a first surface 202 and a second surface 203 that are parallel with the xy-plane of a coordinate system 290. The circuit board 201 is furnished with electrical components one of which is denoted with a reference number 220. The electrical device comprises light sources one of which is illustrated in FIG. 2b and denoted with a reference number 204. One of light beams emitted by the light source 204 is depicted with a dashed line arrow shown in FIG. 2b. The light sources are contained by a light source element 221. The electrical device comprises light guides 205 and 206. Each light guide is configured to receive, at a first end of the light guide, light from the respective light source and to conduct the received light to a second end of the light guide so that the light crosses, in a direction parallel with the circuit board, an edge 208 of the circuit board. The second end of each light guide constitutes a display surface for showing the light to a user of the electrical device. The second end of the light guide 205 constitutes the display surface 207 as illustrated in FIG. 2b. On a fringe area 209 extending from the edge 208 of the circuit board a distance D towards an opposite edge of the circuit board, each of the light guides 205 and 206 is between geometrical planes 280 and 281 parallel and coinciding with the first and second surfaces 202 and 203 of the circuit board 201. Hence, on the above-defined fringe area 209, the light guides 205 and 206 do not require room in directions perpendicular to the circuit board 201. The above-mentioned geometrical planes 280 and 281 are parallel with the xy-plane of the coordinate system 290. In FIG. 2b, the geometrical planes 280 and 281 are depicted with dashed lines. In the exemplifying case illustrated in FIGS. 2a and 2b, each of the light guides comprises an elongated part at least partially located in a cut 211 of the circuit board so that, on the fringe area 209, the elongated part is between the geometrical planes parallel and coinciding with the first and second surfaces 202 and 203 of the circuit board. FIG. 2b illustrates the elongated part 210 of the light guide 205. The free end of the elongated part 210 constitutes the display surface 207. In the exemplifying case illustrated in FIGS. 2a and 2b, the free ends of the elongated parts are flush with the edge 208 of the circuit board. It is, however, also possible that the elongated parts are so short that they are not flush with the edge 208. On the other hand, in some applications, the elongated parts can be so long that they cross the edge 208.

Figure 3:
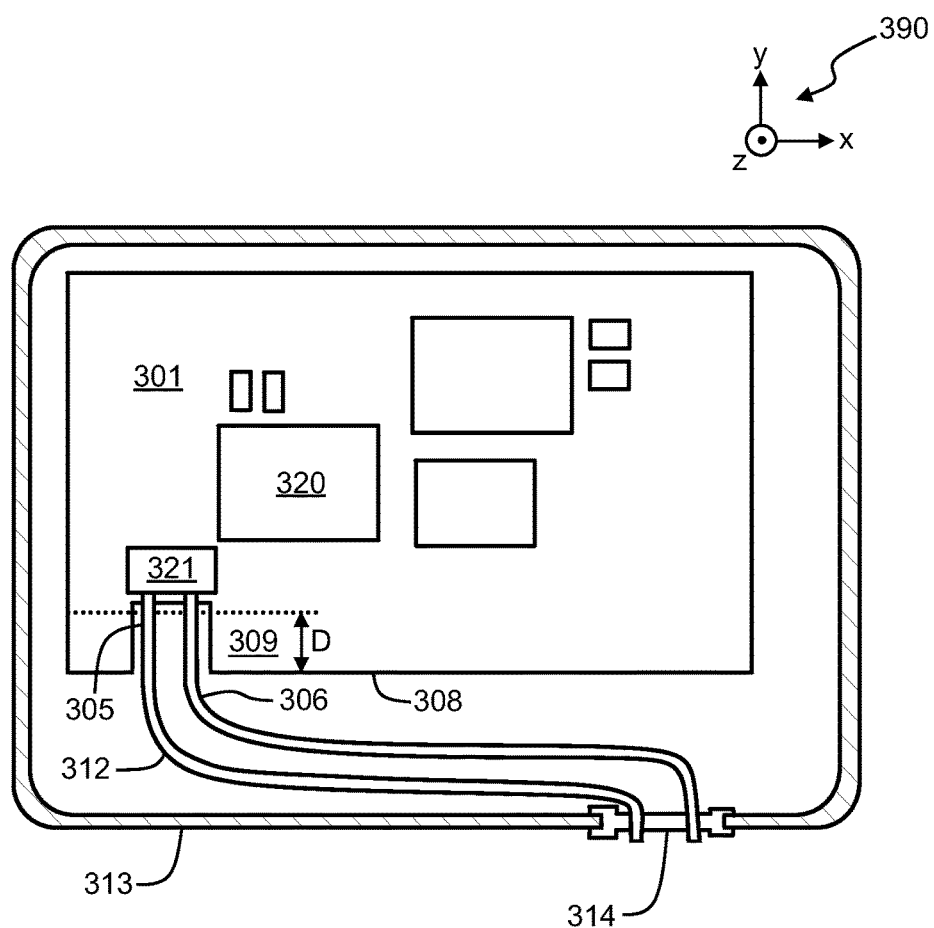
FIG. 3 illustrates an electrical device according to an exemplifying embodiment of the invention.

FIG. 3 illustrates an electrical device according to an exemplifying embodiment of the invention. The electrical device comprises a circuit board 301 having a first surface and a second surface that are parallel with the xy-plane of a coordinate system 390. The circuit board 301 is furnished with electrical components one of which is denoted with a reference number 320. The electrical device comprises light sources that are contained by a light source element 321. The electrical device comprises light guides 305 and 306. Each light guide is configured to receive, at a first end of the light guide, light from the respective light source and to conduct the received light to a second end of the light guide so that the light crosses, in a direction parallel with the circuit board, an edge 308 of the circuit board. The second end of each light guide constitutes a display surface for showing the light to a user of the electrical device. On a fringe area 309 extending from the edge 308 of the circuit board a distance D towards an opposite edge of the circuit board, each of the light guides 305 and 306 is between geometrical planes parallel and coinciding with the first and second surfaces of the circuit board 301. Hence, on the above-defined fringe area 309, the light guides 305 and 306 do not require room in directions perpendicular to the circuit board 301. In the exemplifying case illustrated in FIG. 3, each of the light guides comprises an elongated part at least partially located in a cut of the circuit board so that, on the fringe area 309, the elongated part is between the geometrical planes parallel and coinciding with the first and second surfaces of the circuit board. In the exemplifying case illustrated in FIG. 3, each of the elongated part crosses the edge 308 of the circuit board and comprises an extension portion being outside the circuit board. The extension portion of the elongated part of the light guide 305 is denoted with a reference number 312. The electrical device comprises a casing structure 313 having an aperture for the free ends of the elongated parts. FIG. 3 shows a section view of the casing structure 313. In the exemplifying case illustrated in FIG. 3, the extension portions of the elongated parts of the light guides have curved shapes for enabling the free ends of the elongated parts to be in the aperture of the casing structure. Advantageously, at least the extension portions of the elongated parts of the light guides are made of flexible material.

An electrical device according to an exemplifying embodiment of the invention comprises a sealing member 314 surrounding the extension portions of the elongated parts of the light guides 305 and 306. The sealing member 314 is suitable for providing a sealed lead-through for the extension portions. The sealing member can be for example a piece of rubber or soft plastic cast around the elongated parts of the light guides. It is to be noted that also a light guide or light guides according to the prior art can be provided with a sealing member similar to the sealing member 314.

Figure 4A:
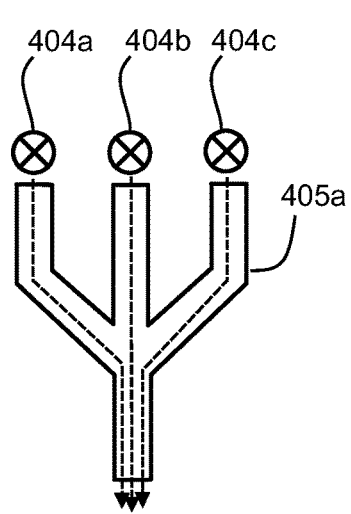
FIGS. 4a and 4b illustrate light guides suitable for electrical devices according to exemplifying embodiments of the invention.
Figure 4B:
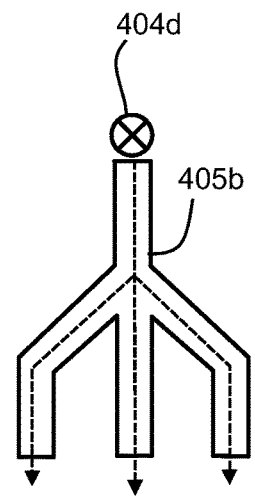

FIGS. 4a and 4b illustrate light guides that are suitable for electrical devices according to exemplifying embodiments of the invention. The light guide 405a shown in FIG. 4a comprises three branches configured to receive lights from various light sources 404a, 404b and 404c. The branches are interconnected into a single light conducting path so as to generate a superposition of the lights received from the light sources. The light source 404a can be configured to emit for example blue light, the light source 404b can be configured to emit red light, and the light source 404c can be configured to emit green light. In this case, the color of the superposition of the lights can be controlled by controlling the light sources 404a, 404b and 404c.

The light guide 405b shown in FIG. 4b comprises three braches branching from a single light conducting path that is configured to receive light from a light source 404d. Each of the branches is configured to conduct a part of the light to the user of the electrical device. The light guides of the kind shown in FIGS. 4a and 4b can be used, for example, for implementing alphanumeric display symbols.

The specific examples provided in the description given above should not be construed as limiting the applicability and/or the interpretation of the appended claims.

What is claimed is:

1. An electrical device comprising:
    a circuit board having a first surface and a second surface;
    at least one light source on the first surface of the circuit board; and
    at least one light guide configured to receive, at a first end of the light guide, light from the light source and to conduct the received light to a second end of the light guide so that the light crosses, in a direction parallel with the circuit board, an edge of the circuit board, the second end of the light guide constituting a display surface for showing the light to a user of the electrical device,
    wherein, on a fringe area extending from the edge of the circuit board a distance towards an opposite edge of the circuit board, the light guide is disposed between geometrical planes, a first one of the geometrical planes being parallel and coinciding with the first surface of the circuit board and a second one of the geometrical planes being parallel and coinciding with the second surface of the circuit board so that, on the fringe area, the light guide is disposed between the geometrical planes without extending through either of the geometrical planes.

2. The electrical device according to claim 1, wherein the light guide comprises a strip of light conducting material, the strip constituting a part of a layer of the circuit board, the second end of the light guide being on the edge of the circuit board.

3. The electrical device according to claim 1, wherein the light guide comprises an elongated part at least partially located in a cut of the circuit board so that, on the fringe area, the elongated part is between the geometrical planes parallel and coinciding with the first and second surfaces of the circuit board, the elongated part including the second end constituting the display surface.

4. The electrical device according to claim 3, wherein the second end of the elongated part is flush with the edge of the circuit board.

5. The electrical device according to claim 3, wherein the elongated part crosses the edge of the circuit board and comprises an extension portion that is outside the circuit board.

6. The electrical device according to claim 5, wherein at least the extension portion of the elongated part is made of flexible material.

7. The electrical device according to claim 5, wherein the electrical device comprises a casing structure having an aperture for the second end of the elongated part.

8. The electrical device according to claim 6, wherein the electrical device comprises a casing structure having an aperture for the second end of the elongated part.

9. The electrical device according to claim 7, wherein the extension portion of the elongated part has a curved shape to enable the second end of the elongated part to be in the aperture of the casing structure.

10. The electrical device according to claim 8, wherein the extension portion of the elongated part has a curved shape to enable the second end of the elongated part to be in the aperture of the casing structure.

11. The electrical device according to claim 5, wherein the electrical device comprises a sealing member surrounding the extension portion of the elongated part and being configured to provide a sealed lead-through for the extension portion of the elongated part.

12. The electrical device according to claim 6, wherein the electrical device comprises a sealing member surrounding the extension portion of the elongated part and being configured to provide a sealed lead-through for the extension portion of the elongated part.

13. The electrical device according to claim 7, wherein the electrical device comprises a sealing member surrounding the extension portion of the elongated part and being configured to provide a sealed lead-through for the extension portion of the elongated part.

14. The electrical device according to claim 8, wherein the electrical device comprises a sealing member surrounding the extension portion of the elongated part and being configured to provide a sealed lead-through for the extension portion of the elongated part.

15. The electrical device according to claim 9, wherein the electrical device comprises a sealing member surrounding the extension portion of the elongated part and being configured to provide a sealed lead-through for the extension portion of the elongated part.

16. The electrical device according to claim 10, wherein the electrical device comprises a sealing member surrounding the extension portion of the elongated part and being configured to provide a sealed lead-through for the extension portion of the elongated part.

17. The electrical device according to claim 1, wherein the light guide comprises two or more branches configured to receive lights from various light sources and interconnected into a single light conducting path to generate a superposition of the lights received from the various light sources.

18. The electrical device according to claim 1, wherein the light guide comprises two or more branches branching from a single light conducting path configured to receive the light from the light source, each of the branches being configured to conduct a part of the light to the user.

19. The electrical device according to claim 1, wherein the electrical device comprises a processing system configured to support at least one of the following data transfer protocols: Internet Protocol (IP), Ethernet protocol, MultiProtocol Label Switching (MPLS) protocol, and Asynchronous Transfer Mode (ATM).

\* \* \* \* \*